(12) United States Patent
Borthakur et al.

(10) Patent No.: US 12,113,138 B2
(45) Date of Patent: *Oct. 8, 2024

(54) SEMICONDUCTOR DEVICES WITH SINGLE-PHOTON AVALANCHE DIODES AND LIGHT SCATTERING STRUCTURES

(71) Applicant: SEMICONDUCTOR COMPONENTS INDUSTRIES, LLC, Scottsdale, AZ (US)

(72) Inventors: Swarnal Borthakur, Boise, ID (US); Marc Allen Sulfridge, Boise, ID (US); Andrew Eugene Perkins, Boise, ID (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/194,714

(22) Filed: Apr. 3, 2023

(65) Prior Publication Data

US 2023/0253513 A1 Aug. 10, 2023

Related U.S. Application Data

(63) Continuation of application No. 16/948,105, filed on Sep. 3, 2020, now Pat. No. 11,652,176.
(Continued)

(51) Int. Cl.
*H01L 31/02* (2006.01)
*G02B 3/06* (2006.01)
(Continued)

(52) U.S. Cl.
CPC .......... *H01L 31/02027* (2013.01); *G02B 3/06* (2013.01); *H01L 27/14605* (2013.01);
(Continued)

(58) Field of Classification Search
CPC ......... H01L 31/02027; H01L 27/14605; H01L 27/14621; H01L 27/14627;
(Continued)

(56) References Cited

U.S. PATENT DOCUMENTS 7,054,534 B1 5/2006 Gunn, III et al.
7,800,192 B2 9/2010 Venezia et al.
(Continued)

OTHER PUBLICATIONS

Yokogawa et al.: "IR sensitivity enhancement of CMOS Image Sensor with diffractive light trapping pixels." Scientific Reports 7, 3832 (2017).
(Continued)

*Primary Examiner* — Tony Ko
*Assistant Examiner* — Mai Thi Ngoc Tran
(74) *Attorney, Agent, or Firm* — Treyz Law Group, P.C.; Joseph F. Guihan

(57) ABSTRACT

An imaging device may include single-photon avalanche diodes (SPADs). To improve the sensitivity and signal-to-noise ratio of the SPADs, light scattering structures may be formed in the semiconductor substrate to increase the path length of incident light through the semiconductor substrate. The light scattering structures may include a low-index material formed in trenches in the semiconductor substrate. One or more microlenses may focus light onto the semiconductor substrate. Areas of the semiconductor substrate that receive more light from the microlenses may have a higher density of light scattering structures to optimize light scattering while mitigating dark current.

19 Claims, 10 Drawing Sheets

Related U.S. Application Data

(60) Provisional application No. 62/981,902, filed on Feb. 26, 2020, provisional application No. 62/943,475, filed on Dec. 4, 2019.

(51) Int. Cl.
| | | |
|---|---|---|
| *H01L 27/146* | (2006.01) | |
| *H01L 31/0232* | (2014.01) | |
| *H01L 31/055* | (2014.01) | |
| *H01L 31/107* | (2006.01) | |
| *H04N 25/63* | (2023.01) | |

(52) U.S. Cl.
CPC .. *H01L 27/14621* (2013.01); *H01L 27/14627* (2013.01); *H01L 27/14629* (2013.01); *H01L 27/1463* (2013.01); *H01L 27/14643* (2013.01); *H01L 27/14649* (2013.01); *H01L 31/02327* (2013.01); *H01L 31/055* (2013.01); *H01L 31/107* (2013.01); *H01L 27/1464* (2013.01); *H04N 25/63* (2023.01)

(58) Field of Classification Search
CPC ........... H01L 27/14629; H01L 27/1463; H01L 27/14643; H01L 27/14649; H01L 31/02327; H01L 31/055; H01L 31/107; H01L 27/1464; G02B 3/06; H04N 25/63
USPC .............................................. 250/208.1, 226
See application file for complete search history.

(56) References Cited

U.S. PATENT DOCUMENTS

| | | | |
|---|---|---|---|
| 8,889,455 | B2 | 11/2014 | Duane et al. |
| 9,373,732 | B2 | 6/2016 | Velichko |
| 10,304,987 | B2 | 5/2019 | Droz et al. |
| 11,032,496 | B2 | 6/2021 | Webster |
| 11,289,524 | B2 * | 3/2022 | Sulfridge .......... H01L 27/14685 |
| 2007/0075423 | A1 | 4/2007 | Ke et al. |
| 2008/0303932 | A1 | 12/2008 | Wang et al. |
| 2013/0015331 | A1 | 1/2013 | Birk et al. |
| 2013/0082286 | A1 | 4/2013 | Finkelstein et al. |
| 2013/0193546 | A1 | 8/2013 | Webster et al. |
| 2014/0015085 | A1 | 1/2014 | Ikeda et al. |
| 2014/0049783 | A1 | 2/2014 | Royo Royo |
| 2014/0077323 | A1 | 3/2014 | Velichko et al. |
| 2015/0340391 | A1 | 11/2015 | Webster |
| 2017/0110493 | A1 * | 4/2017 | Yokogawa ........ H01L 31/03762 |
| 2017/0339355 | A1 | 11/2017 | Lenchenkov et al. |
| 2017/0347042 | A1 * | 11/2017 | Borthakur ............ H04N 23/672 |
| 2017/0366769 | A1 | 12/2017 | Mlinar et al. |
| 2018/0026147 | A1 | 1/2018 | Zhang et al. |
| 2018/0182806 | A1 | 6/2018 | Jin et al. |
| 2018/0211990 | A1 | 7/2018 | Yorikado et al. |
| 2018/0308881 | A1 | 10/2018 | Hynecek |
| 2019/0097075 | A1 | 3/2019 | Rae |
| 2019/0131339 | A1 * | 5/2019 | Chiang ............. H01L 27/14687 |
| 2019/0131478 | A1 | 5/2019 | Wang et al. |
| 2019/0165026 | A1 | 5/2019 | Kuo et al. |
| 2019/0326482 | A1 | 10/2019 | Brick et al. |
| 2020/0020730 | A1 | 1/2020 | Mlinar et al. |
| 2020/0058808 | A1 | 2/2020 | Morimoto et al. |
| 2020/0284883 | A1 | 9/2020 | Ferreira et al. |
| 2021/0082978 | A1 | 3/2021 | Hsieh |
| 2021/0082982 | A1 * | 3/2021 | Oshiyama ......... H01L 27/14629 |
| 2021/0408090 | A1 | 12/2021 | Kohyama |
| 2022/0199668 | A1 | 6/2022 | Ootani et al. |

OTHER PUBLICATIONS

Park et al.: "Pixel Technology for Improving IR Quantum Efficiency of Backside-illuminated CMOS Image Sensor." International Image Sensor Society, 2019 Workshop. Jun. 23-27, 2019.

Green et al.: "Characterization of 23-Percent Efficient Silicon Solar Cells." IEEE Transactions on Electron Devices. vol. 37, No. 2. Feb. 1990.

* cited by examiner

SEMICONDUCTOR DEVICES WITH SINGLE-PHOTON AVALANCHE DIODES AND LIGHT SCATTERING STRUCTURES

This application is a continuation of non-provisional patent application Ser. No. 16/948,105, filed Sep. 3, 2020, which claims the benefit of provisional patent application No. 62/943,475, filed Dec. 4, 2019, and provisional patent application No. 62/981,902, filed Feb. 26, 2020, which are all hereby incorporated by reference herein in their entireties.

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals.

Conventional image sensors may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. Single-photon avalanche diodes may be capable of single-photon detection.

It is within this context that the embodiments described herein arise.

DETAILED DESCRIPTION

Embodiments of the present invention relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves, and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices (such as the ones described in connection with FIGS. 1-4), on the other hand, the photon detection principle is different. The light sensing diode is biased above its breakdown point, and when an incident photon generates an electron or hole, this carrier initiates an avalanche breakdown with additional carriers being generated. The avalanche multiplication may produce a current signal that can be easily detected by readout circuitry associated with the SPAD. The avalanche process can be stopped (or quenched) by lowering the diode bias below its breakdown point. Each SPAD may therefore include a passive and/or active quenching circuit for halting the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
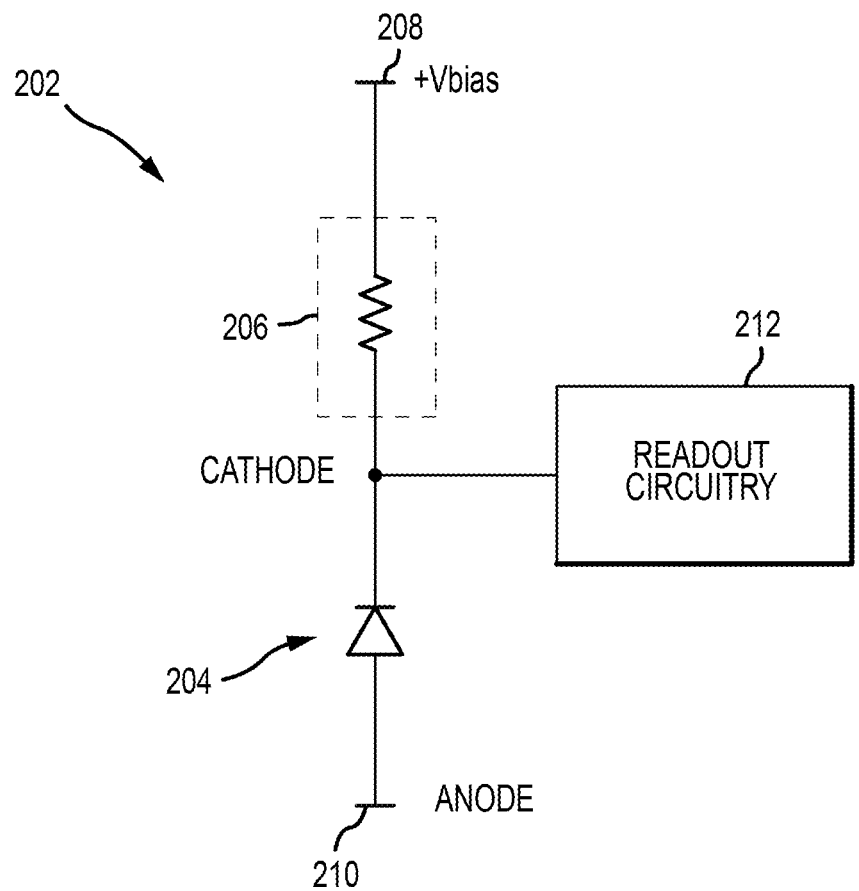
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 210 (e.g., a ground power supply voltage terminal) and a second supply voltage terminal 208 (e.g., a positive power supply voltage terminal). In particular, SPAD device 202 includes a SPAD 204 having an anode terminal connected to power supply voltage terminal 210 and a cathode terminal connected directly to quenching circuitry 206. SPAD device 202 that includes SPAD 204 connected in series with a quenching resistor 206 is sometimes referred to collectively as a photo-triggered unit or "microcell." During operation of SPAD device 202, supply voltage terminals 208 and 210 may be used to bias SPAD 204 to a voltage that is higher than the breakdown voltage (e.g., bias voltage Vbias is applied to terminal 208). Breakdown voltage is the largest reverse voltage that can be applied to SPAD 204 without causing an exponential increase in the leakage current in the diode. When SPAD 204 is reverse biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor component is used to form quenching circuitry 206. This is an example of passive quenching circuitry.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing. In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to terminal 208 or any desired portion of the SPAD device. In some cases, quenching circuitry 206 may be considered integral with readout circuitry 212.

Because SPAD devices can detect a single incident photon, the SPAD devices are effective at imaging scenes with low light levels. Each SPAD may detect the number of photons that are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
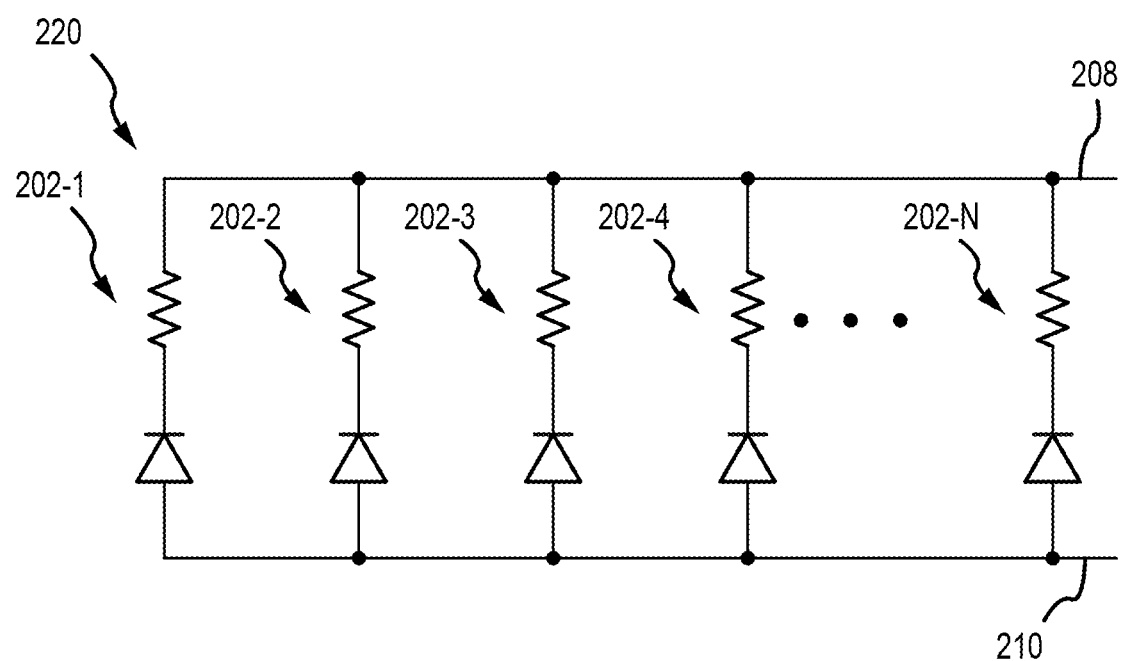
FIG. 2 is a diagram of an illustrative silicon photomultiplier in accordance with an embodiment.

Multiple SPAD devices may be grouped together to help increase dynamic range. FIG. 2 is a circuit diagram of an illustrative group 220 of SPAD devices 202. The group or array of SPAD devices may sometimes be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier 220.

Each SPAD device 202 may sometimes be referred to herein as a SPAD pixel 202. Although not shown explicitly in FIG. 2, readout circuitry for the silicon photomultiplier 220 may measure the combined output current from all of SPAD pixels in the silicon photomultiplier. Configured in this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of FIG. 2 in which the plurality of SPAD pixels 202 share a common output in silicon photomultiplier 220 is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
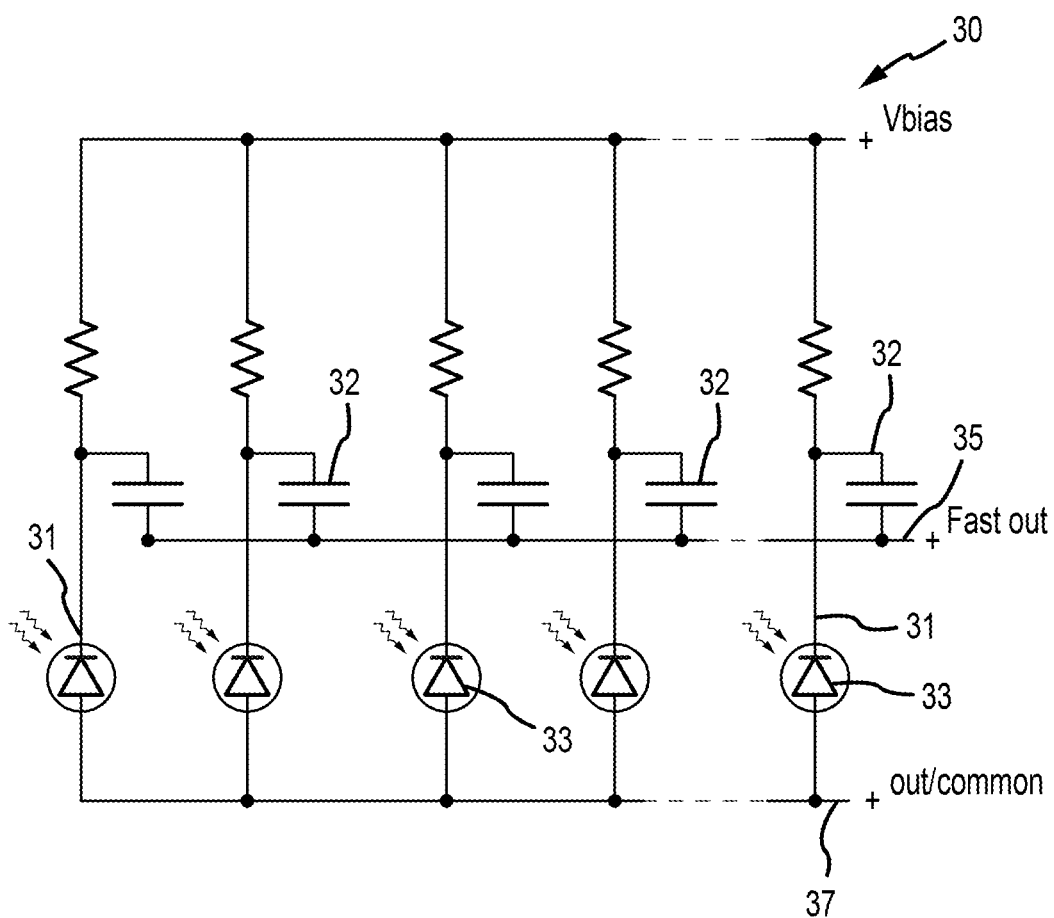
FIG. 3 is a schematic diagram of an illustrative silicon photomultiplier with a fast output terminal in accordance with an embodiment.

FIG. 3 illustrates a silicon photomultiplier 30. As shown in FIG. 3, SiPM has a third terminal 35 which is capacitively coupled to each cathode terminal 31 in order to provide a fast readout of the avalanche signals from the SPADs 33. When then SPADs 33 emits a current pulse, part of the resulting change in voltage at the cathode 31 will be coupled via the mutual capacitance into the third ("fast") output terminal 35. Using the third terminal 35 for readout avoids the compromised transient performance resulting from the relatively large RC time constant associated with the biasing circuit that biases the top terminal of the quenching resistor.

Figure 4:
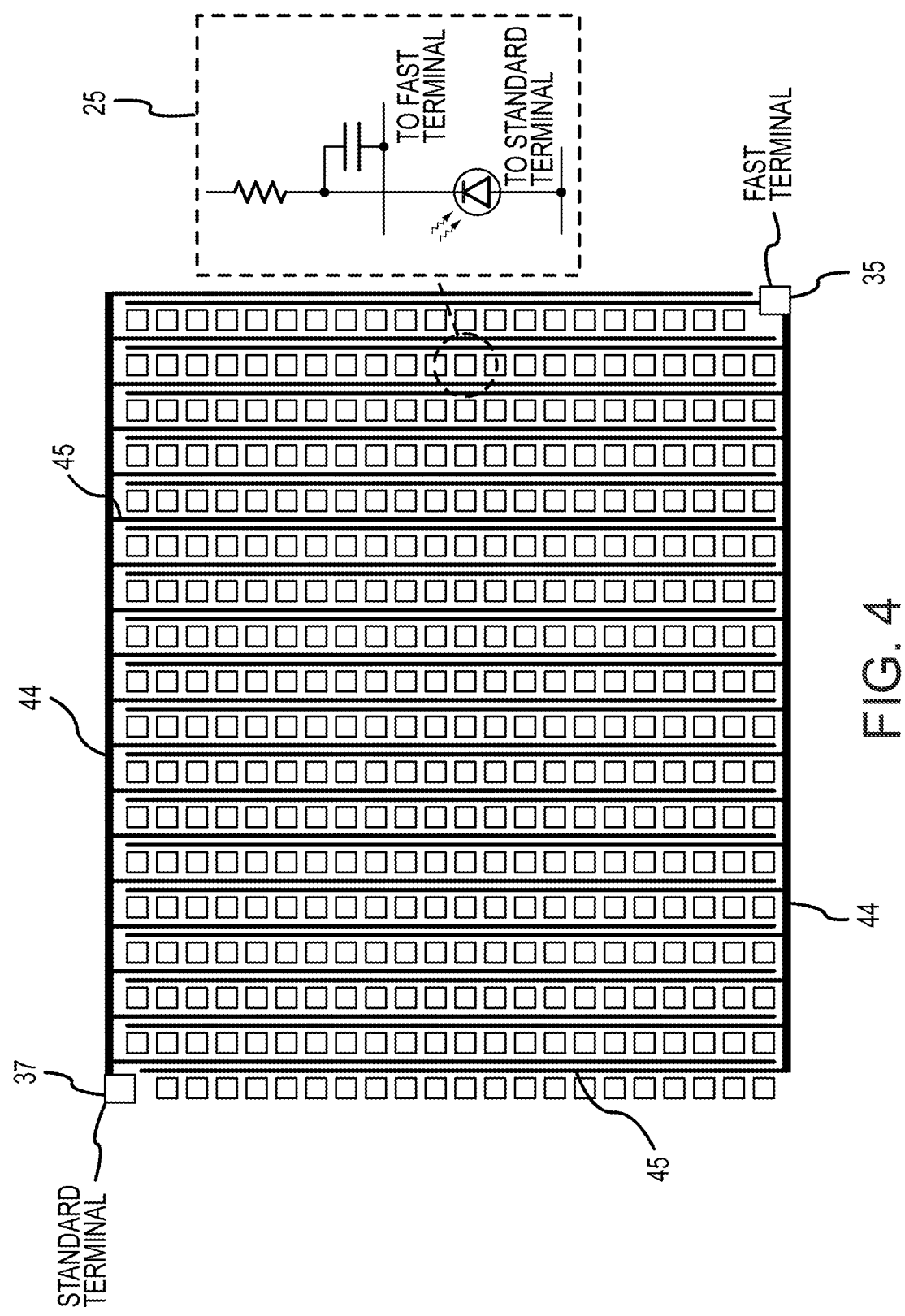
FIG. 4 is a diagram of an illustrative silicon photomultiplier comprising an array of microcells.

It will be appreciated by those skilled in the art that silicon photomultipliers include major bus lines 44 and minor bus lines 45 as illustrated in FIG. 4. The minor bus lines 45 may connect directly to each individual microcell 25. The minor bus lines 45 are then coupled to the major bus lines 44 which connect to the bond pads associated with terminals 37 and 35. Typically, the minor bus lines 45 extend vertically between the columns of microcells 25, whereas the major bus lines 44 extend horizontally adjacent the outer row of the microcells 25.

Figure 5:
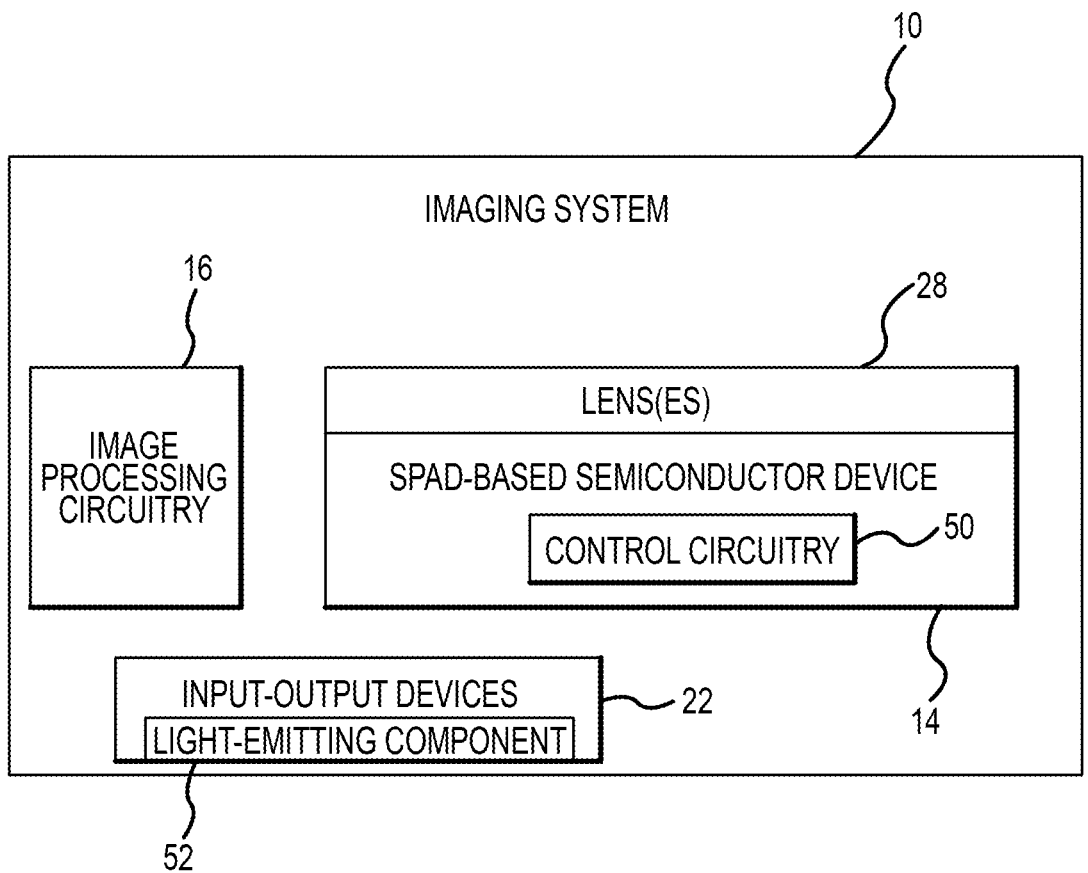
FIG. 5 is a schematic diagram of an illustrative imaging system that includes a SPAD-based semiconductor device in accordance with an embodiment.

An imaging system 10 with a SPAD-based semiconductor device is shown in FIG. 5. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system 10 may be used for LIDAR applications. Imaging system 10 may sometimes be referred to as a SPAD-based imaging system.

Imaging system 10 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more). In some SPAD-based semiconductor devices, each SPAD pixel may be covered by a respective color filter element and/or microlens.

SPAD-based semiconductor device 14 may include circuitry such as control circuitry 50. The control circuitry for the SPAD-based semiconductor device may be formed either on-chip (e.g., on the same semiconductor substrate as the SPAD devices) or off-chip (e.g., on a different semiconductor substrate as the SPAD devices). The control circuitry may control operation of the SPAD-based semiconductor device. For example, the control circuitry may operate active quenching circuitry within the SPAD-based semiconductor device, may control a bias voltage provided to bias voltage supply terminal 208 of each SPAD, may control/monitor the readout circuitry coupled to the SPAD devices, etc.

The SPAD-based semiconductor device 14 may optionally include additional circuitry such as logic gates, digital counters, time-to-digital converters, bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc. Any of the aforementioned circuits may be considered part of the control circuitry 50 of FIG. 5.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene. In some cases, some or all of control circuitry 50 may be formed integrally with image processing circuitry 16.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component 52 may be included in the imaging system to emit light (e.g., infrared light or light of any other desired type). Light-emitting component 52 may be a laser, light-emitting diode, or any other desired type of light-emitting component. Semiconductor device 14 may measure the reflection of the light off of an object to measure distance to the object in a LIDAR (light detection and ranging) scheme. Control circuitry 50 that is used to control operation of the SPAD-based semiconductor device may also optionally be used to control operation of light-emitting component 52. Image processing circuitry 16 may use known times (or a known pattern) of light pulses from the light-emitting component while processing data from the SPAD-based semiconductor device.

Figure 6:
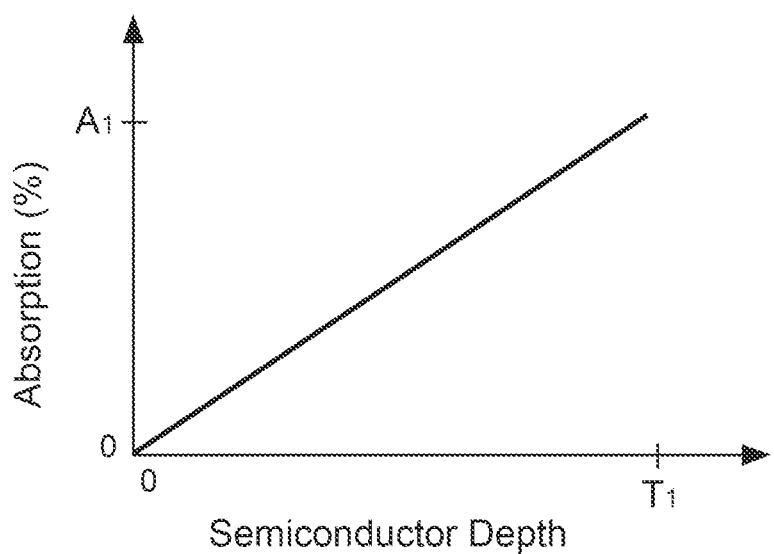
FIG. 6 is a graph of absorption percentage as a function of semiconductor depth for an illustrative SPAD-based semiconductor device in accordance with an embodiment.

FIG. 6 is a graph showing absorption percentage as a function of semiconductor depth for a SPAD-based semiconductor device. As shown, the likelihood of a photon being absorbed (e.g., the absorption percentage) increases with increasing semiconductor depth. To improve the sensitivity of a SPAD-based semiconductor device, it would therefore be desirable to increase the thickness of the semiconductor substrate. However, manufacturing considerations and other design factors may prevent or discourage semiconductor substrates from being thick enough for a target absorption percentage.

To increase the absorption percentage without increasing semiconductor substrate thickness, light scattering structures may be included in the SPAD-based semiconductor device. The scattering structures may scatter incident light (e.g., using a low-index material that fills trenches in the semiconductor substrate), thereby increasing the path length of the light through the semiconductor substrate and increasing the probability of the incident light being absorbed by the semiconductor. Scattering the incident light (using refraction and/or diffraction) to increase the path length may be particularly helpful for incident light of higher wavelengths. The SPAD-based semiconductor devices described herein may be used to sense near infrared light or light of any other desired type.

Figure 7:
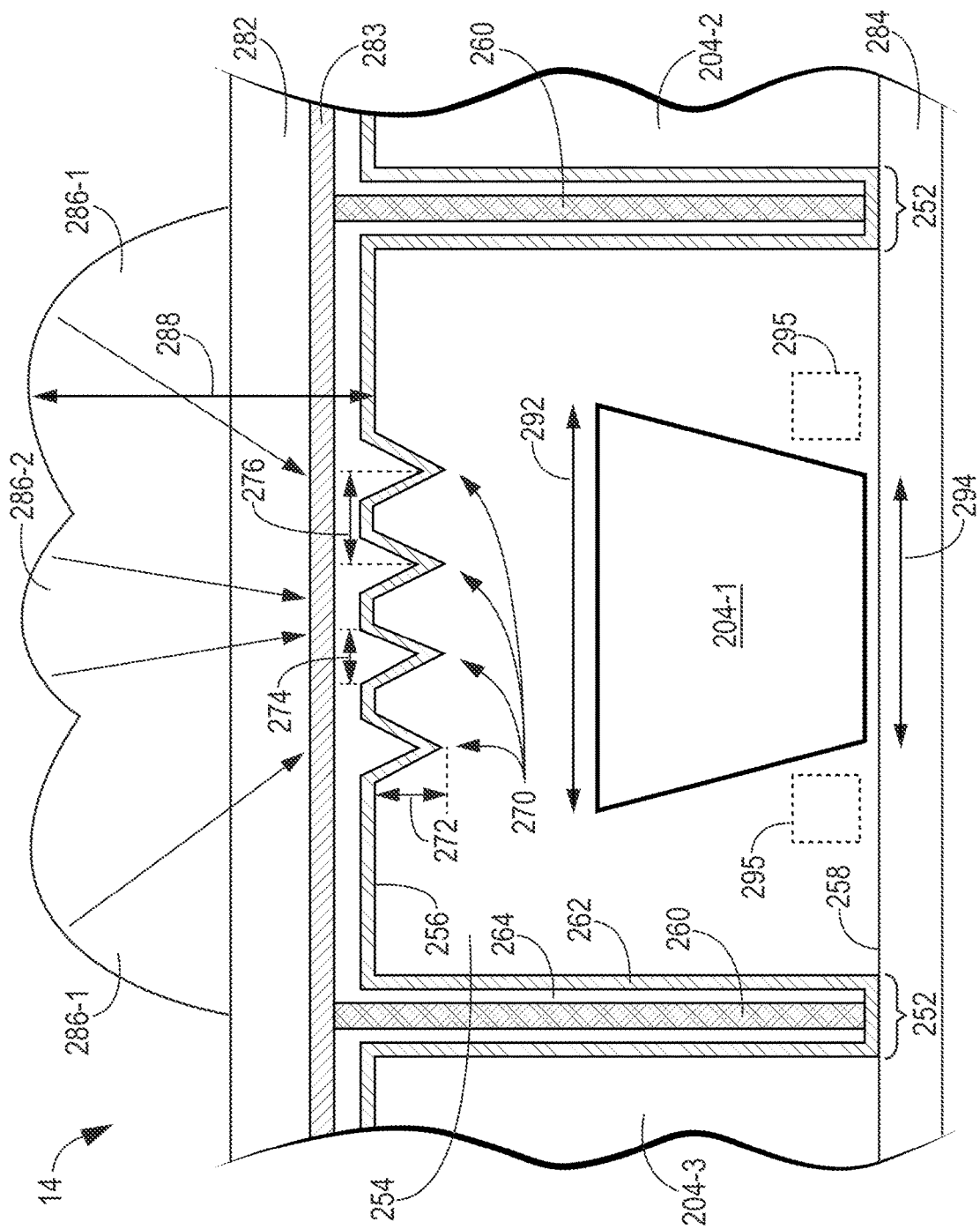
FIG. 7 is a cross-sectional side view of a SPAD-based semiconductor device having light scattering structures and a toroidal microlens in accordance with an embodiment.

FIG. 7 is a cross-sectional side view of an illustrative SPAD-based semiconductor device having scattering structures. SPAD-based semiconductor device 14 includes a SPAD 204-1 that is adjacent to respective SPADs (e.g., SPAD 204-2 and SPAD 204-3 in FIG. 7). Each SPAD may be considered part of a respective SPAD device, SPAD pixel, or microcell (e.g., microcell 202 in FIG. 1). The SPAD-based semiconductor device 14 in FIG. 7 is a backside illuminated (BSI) device (e.g., incident light passes through the back surface of the substrate). SPAD 204-1 may be isolated from the adjacent SPADs by isolation structures 252. The isolation structures may include deep trench isolation (DTI) that includes metal-filled trenches.

In particular, trenches may be formed in a substrate 254 (e.g., a semiconductor substrate formed from a material such as silicon) that extends from the back surface 256 to the front surface 258. The trench for isolation structures 252 therefore extends completely through the semiconductor substrate 254. The trench may be etched from the backside of the substrate (e.g., from surface 256 towards surface 258). In this case, the isolation structures may be referred to as backside deep trench isolation (BDTI). Forming the trench as backside deep trench isolation (as in FIG. 7) may mitigate complexity and cost during manufacturing. However, the trench may alternatively be etched from the front side of the substrate (e.g., from surface 258 towards surface 256). In this case, the isolation structures may be referred to as front side deep trench isolation (FDTI).

The trench of isolation structures 252 may be filled with a metal filler 260 (e.g., tungsten or any other desired metal). The metal filler isolates SPAD 204-1 from adjacent SPADs.

A high dielectric constant coating 262 may be formed in the trench between the substrate 254 and metal filler 260. The high dielectric constant coating 262 (sometimes referred to as high k coating 262 or passivation layer 262) may mitigate dark current. As one example, the passivation coating may be an oxide coating (e.g., aluminum oxide, hafnium oxide, tantalum oxide, etc.). A buffer layer 264 may be formed between passivation coating 262 and metal filler 260. The buffer layer 264 may be formed from silicon dioxide or another desired material (e.g., a material compatible with both the passivation coating and the metal filler).

The isolation structures may form a ring around the microcell including SPAD 204-1. SPAD 204-1 may be completely laterally surrounded by isolation structures 252.

In addition to the isolation structures, scattering structures 270 may be formed in the substrate. Scattering structures 270 may be configured to scatter incident light (e.g., using a low-index material that fills trenches in substrate 254), thereby increasing the path length of the light through the semiconductor substrate and increasing the probability of the incident light being absorbed by the semiconductor. Scattering the incident light (using refraction and/or diffraction) to increase the path length may be particularly helpful for incident light of higher wavelengths (e.g., near infrared light).

The scattering structures may be formed using backside trenches (e.g., trenches that extend from surface 256 towards surface 258). The backside trenches may be filled by the same passivation coating 262 and buffer layer 264 as isolation structures 252. As shown, passivation coating 262 has portions in the trenches of isolation structures 252 and portions in the trenches of scattering structures 270. This enables the passivation layer in both isolation structures 252 and scattering structures 270 to be formed in the same deposition step during manufacturing if desired. The thickness of passivation coating 262 may be uniform in isolation structures 252 and scattering structures 270 or may be different in isolation structures 252 and scattering structures 270.

The material(s) that fill the trenches (e.g., buffer 264 and passivation layer 262) of light scattering structures 270 may have a lower refractive index than substrate 254 (e.g., a refractive index that is lower by more than 0.1, more than 0.2, more than 0.3, more than 0.5, more than 1.0, more than 1.5, more than 2.0, etc.). The low-index material in the trenches causes refractive scattering of incident light.

As shown in FIG. 7, buffer layer 264 has portions in the trenches of isolation structures 252 and portions in the trenches of scattering structures 270. This enables the buffer layer 264 in both isolation structures 252 and scattering structures 270 to be formed in the same deposition step during manufacturing if desired. The thickness of buffer layer 264 may be uniform in isolation structures 252 and scattering structures 270 or may be different in isolation structures 252 and scattering structures 270. As shown in FIG. 7, the buffer layer 264 may fill trenches for scattering structures 270 and extend above the plane of surface 256. The upper surface of buffer layer 264 may be coplanar with the upper surface of metal filler 260.

Scattering structures 270 scatter incident light, thereby increasing the path length of the light through the semiconductor substrate and increasing the probability of the incident light being absorbed by the semiconductor. Isolation structures 252 prevent the scattered light from reaching an adjacent SPAD and causing cross-talk.

One or more microlenses 286 may be formed over SPAD 204-1. In the arrangement of FIG. 7, a first microlens 286-1 and a second microlens 286-2 are included. Microlens 286-1 has a toroidal shape (e.g., a ring shape with a central opening) and microlens 286-2 fills the opening of microlens 286-1. The microlenses may focus light towards light scattering structures 270 and SPAD 204-1.

A planarization layer 282 may optionally be interposed between buffer layer 264 and microlens(es) 286. The planarization layer may increase the distance 288 between the back surface of the substrate (256) and the upper surface of the microlens. Increasing distance 288 may improve the focusing ability of microlenses 286-1 and 286-2. An additional oxide layer 284 may be formed at the front side of substrate 254. An additional oxide layer 283 may also be formed on the back side of substrate 254 between buffer layer 264 and planarization layer 282. Oxide layers 283 and 284 may be formed from the same material or different materials (e.g., silicon dioxide).

The light scattering structures each have a height 272 (sometimes referred to as depth) and a width 274. The light scattering structures also have a pitch 276 (e.g., the center-to-center separation between each light scattering structure). In general, each scattering structure may have a height 272 of less than 5 micron, less than 3 micron, less than 2 micron, less than 1 micron, less than 0.5 micron, less than 0.1 micron, greater than 0.01 micron, greater than 0.5 micron, greater than 1 micron, between 1 and 2 micron, between 0.5 and 3 micron, between 0.3 micron and 10 micron, etc. Each scattering structure may have a width 274 of less than 5 micron, less than 3 micron, less than 2 micron, less than 1 micron, less than 0.5 micron, less than 0.1 micron, greater than 0.01 micron, greater than 0.5 micron, greater than 1 micron, between 1 and 2 micron, between 0.5 and 3 micron, between 0.3 micron and 10 micron, etc. The pitch 276 may be less than micron, less than 3 micron, less than 2 micron, less than 1 micron, less than 0.5 micron, less than 0.1 micron, greater than 0.01 micron, greater than 0.5 micron, greater than 1 micron, between 1 and 2 micron, between 0.5 and 3 micron, between 0.3 micron and 10 micron, etc. The ratio of the width 274 to the pitch 276 may be referred to as the duty cycle or the etch percentage for the substrate. The duty cycle (etch percentage) indicates how much unetched substrate is present between each pair of scattering structures and how much of the upper surface of the substrate is etched to form the light scattering structures. The ratio may be 100% (e.g., each scattering structure is immediately adjacent to surrounding scattering structures), lower than 100%, lower than 90%, lower than 70%, lower than 60%, greater than 50%, greater than 70%, between (and including) 50% and 100%, etc. The semiconductor substrate may have a thickness of greater than 4 micron, greater than 6 micron, greater than 8 micron, greater than 10 micron, greater than 12 micron, less than 12 micron, between 4 and 10 micron, between 5 and 20 micron, less than micron, less than 6 micron, less than 4 micron, less than 2 micron, greater than 1 micron, etc.

In the example of FIG. 7, the scattering structures 270 have angled sidewalls (e.g., sidewalls that are non-orthogonal and non-parallel to back surface 256). The scattering structures may be pyramidal or may have a triangular cross-section that extends along a longitudinal axis (e.g., a triangular prism). The non-orthogonal angle may be greater than 10 degrees, greater than 30 degrees, greater than 60 degrees, less than 80 degrees, between 20 and 70 degrees, etc. The example of angled sidewalls in FIG. 7 is merely illustrative. The scattering structures may have vertical sidewalls (orthogonal to surface 256) if desired.

The arrangement and dimensions of scattering structures 270 may be selected to optimize the conversion of incident light. As shown in FIG. 7, the area of SPAD 204-1 may not include the entirety of the substrate 254. As shown, the SPAD may include a first portion having a first width 292 and a second portion having a second width 294 that is different than the first portion. In FIG. 7, width 294 is smaller than width 292. Consequently, dead zones 295 of semiconductor 254 (that are not part of SPAD 204-1) may be formed on either side of SPAD 204-1. The arrangement and dimensions of scattering structures 270 may be selected to direct incident light to SPAD 204-1 and not the dead zones.

Figure 8:
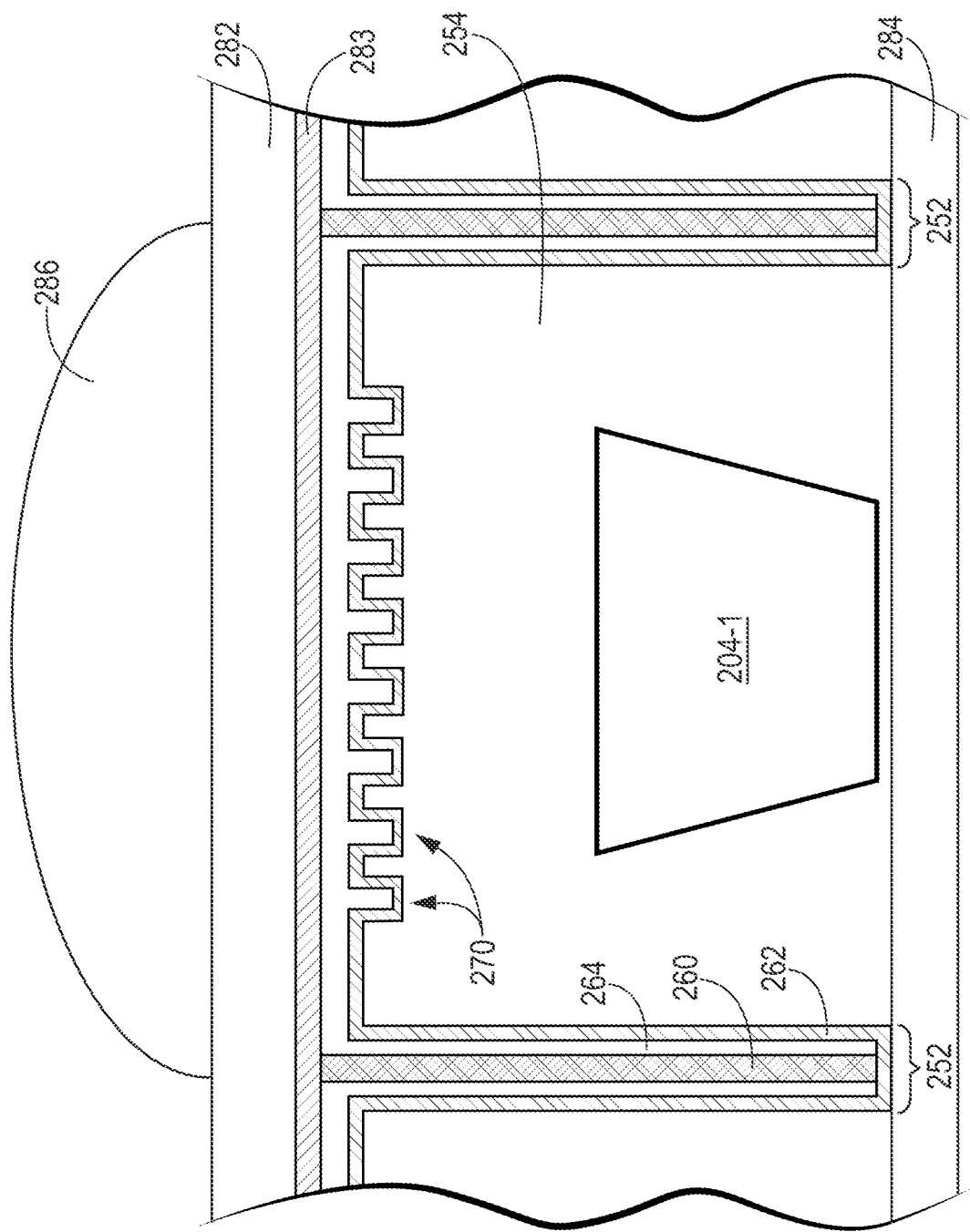
FIG. 8 is a cross-sectional side view of a SPAD-based semiconductor device having light scattering structures and a spherical microlens in accordance with an embodiment.

FIG. 8 is a cross-sectional side view of an illustrative SPAD-based semiconductor device showing an example where light scattering structures 270 have vertical sidewalls (instead of angled sidewalls as in FIG. 7). These type of light scattering structures may primarily scatter light using diffraction whereas the light scattering structures in FIG. 7 may primarily scatter light using refraction. FIG. 8 also shows how a single microlens 286 may be formed over SPAD 204-1 (instead of multiple microlenses as in FIG. 7). In FIG. 8, microlens 286 may have a thickness of greater than 0.5 micron, greater than 1 micron, greater than 2 microns, greater than 3 microns, greater than 5 microns, greater than 8 microns, between (and including) 1 and 10 microns, less than 10 microns, less than 5 microns, between (and including) 5 and 10 microns, between (and including) 3 and 5 microns, etc. These thickness ranges may apply to any of the microlenses described herein.

Figure 9:
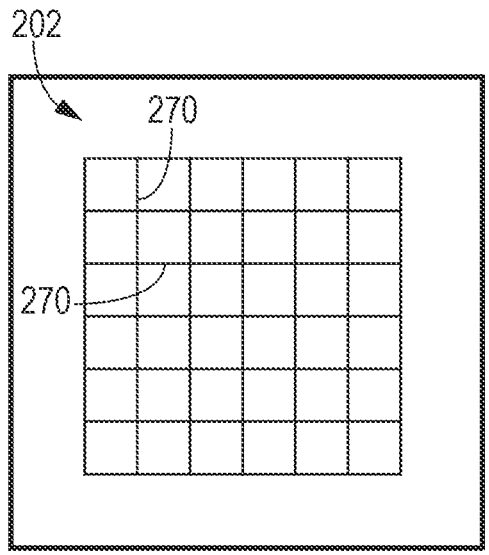
FIG. 9 is a top view of an illustrative microcell for a SPAD-based semiconductor device showing a uniform layout for light scattering structures in accordance with an embodiment.
Figure 10:
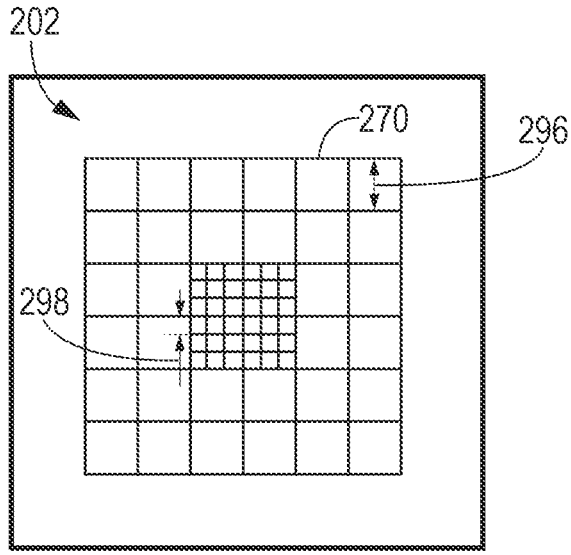
FIG. 10 is a top view of an illustrative microcell for a SPAD-based semiconductor device showing a layout for light scattering structures with different densities in different portions in accordance with an embodiment.
Figure 11:
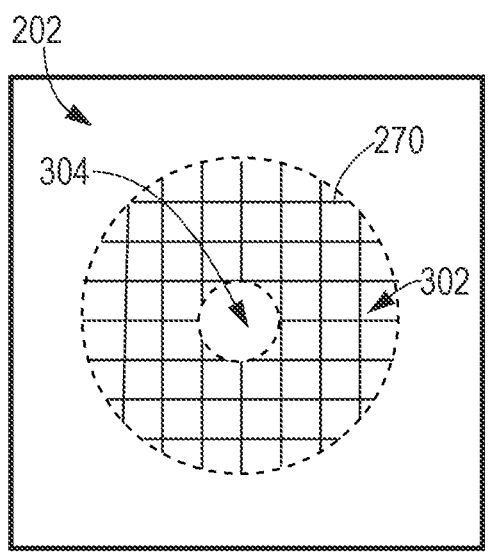
FIG. 11 is a top view of an illustrative microcell for a SPAD-based semiconductor device showing a layout for light scattering structures with portions where the light scattering structures are omitted entirely in accordance with an embodiment.

FIGS. 9-11 are top views of illustrative microcells showing possible layouts for the light scattering structures shown in FIGS. 7 and 8. FIG. 9 shows an illustrative example where the light scattering structures extend in rows and columns across the microcell 202 (over SPAD 204-1). In FIG. 9, the spacing of the light scattering structures is uniform across the microcell. The light scattering structures may therefore be referred to as having a uniform density (number of light scattering structures per unit area).

In FIG. 10, on the other hand, the light scattering structures have a non-uniform density. A first portion of the light scattering structures are separated by a first distance 296. A second portion of the light scattering structures are separated by a second distance 298. In FIG. 10, the first (peripheral) portion forms a ring around the second (central) portion. Distance 298 may be smaller than distance 296. Accordingly, the lights scattering structures in the first portion have a density that is smaller than in the second portion. Arranging light scattering structures with a non-uniform density in this manner may help direct light to SPAD 204-1 in an optimal manner (e.g., to SPAD 204-1 and not dead zones 295).

In general, etching substrate 254 (e.g., to form light scattering structures) may cause an increase in dark current in the SPAD-based semiconductor device. Accordingly, light scattering structures may be omitted where possible to minimize dark current while still optimizing absorption. Omitting light scattering structures may include reducing the density of the light scattering structures to a non-zero magnitude (as in FIG. 10) or entirely omitting the light scattering structures in a certain area of the microcell (e.g., to a density of zero).

FIG. 11 is a top view of a microcell showing how the light scattering structures may be omitted entirely in a certain portion of the microcell. The microcell may include a ring-shaped area 302 that includes light scattering structures 270. The ring-shaped area 302 has a central opening 304 that does not include any light scattering structures. This type of arrangement may, for example, be used when the microcell is covered by a toroidal microlens (that focuses light primarily on area 302). The light scattering structures are omitted in area 304 so as to not cause unnecessary dark current.

Figure 12:
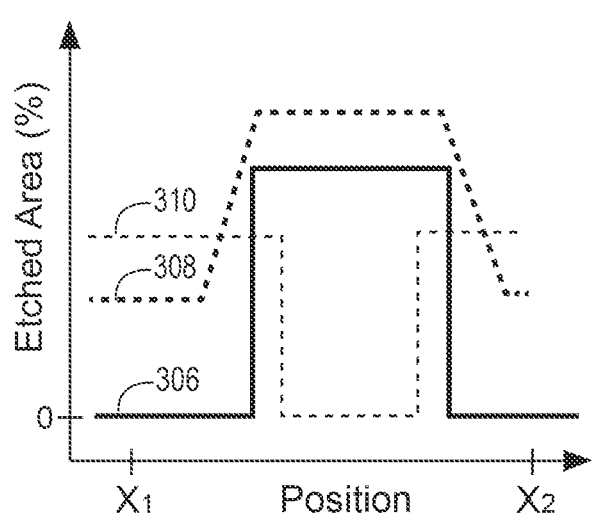
FIG. 12 is a graph showing illustrative profiles for the percentage of a substrate that is etched for light scattering structures across a microcell in accordance with an embodiment.

FIG. 12 is a graph showing various profiles for the etched area percentage (e.g., the percentage of the substrate occupied by light scattering structures) across the microcell. The borders of the microcell may be positions $x_1$ and $x_2$, respectively. As shown by profile 306, the etched area percentage may be 0 in the periphery of the microcell and some higher amount in the center of the microcell. The inverse arrangement is also possible, as reflected by profile 310 (where the etched area percentage is 0 in the center of the microcell and some higher amount at the periphery of the microcell). The changes in etched area percentage (light scattering structure density) may be step changes (as in profiles 306 and 310) or gradual (as in profile 308). In general, the light scattering structures may have any desired density profile.

Figure 13:
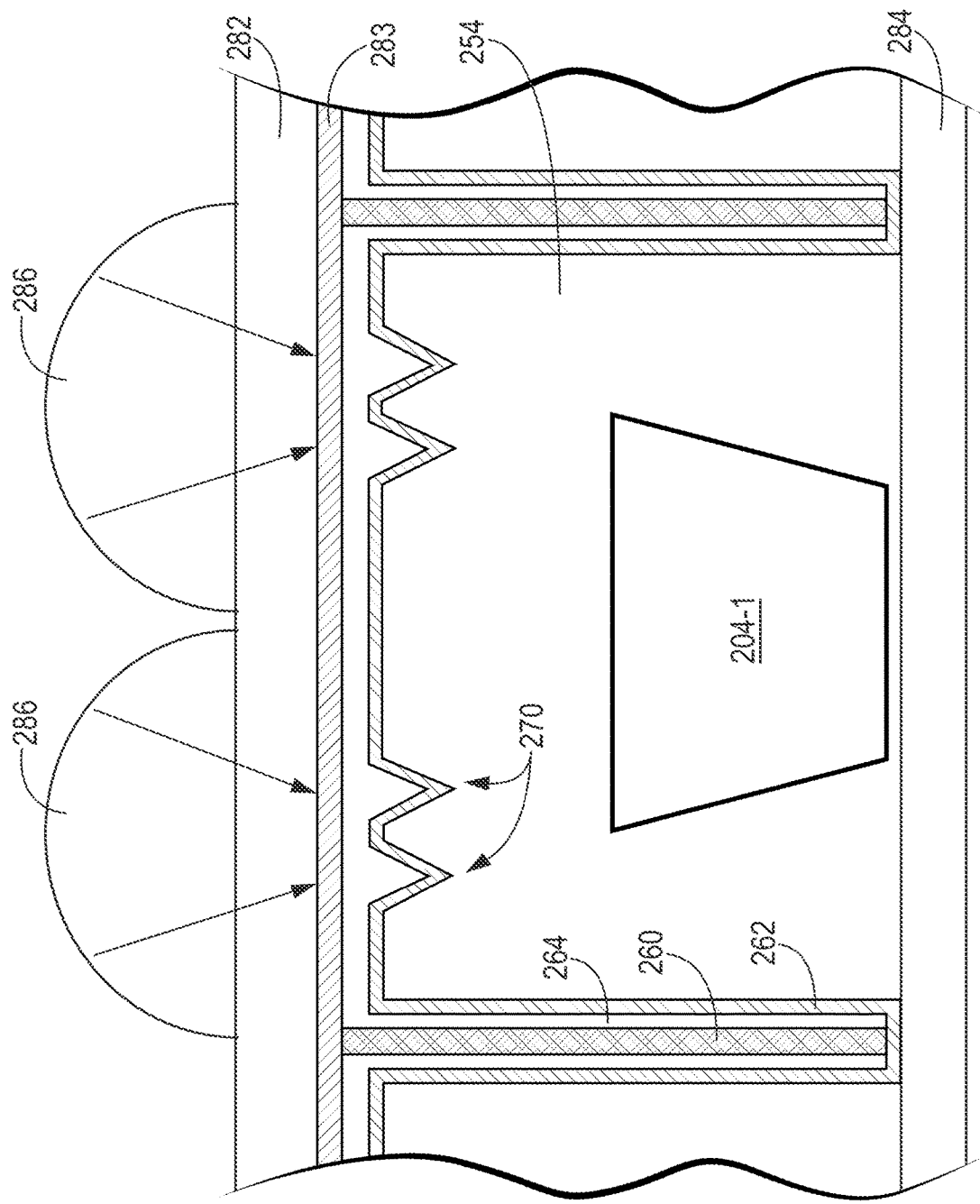
FIG. 13 is a cross-sectional side view of a SPAD-based semiconductor device having light scattering structures, a toroidal microlens, and portions where the light scattering structures are omitted entirely in accordance with an embodiment.

FIG. 13 is a cross-sectional side view of an illustrative SPAD-based semiconductor device showing another possible arrangement for the microlens and light scattering structures. As shown, a toroidal microlens 286 may be formed over the SPAD 204-1. Toroidal microlens 286 may focus light on a ring-shaped area of substrate 254. Accordingly, light scattering structures 270 may have a ring-shaped layout (as shown in FIG. 11) and may be omitted under a central opening of the toroidal microlens. Omitting the light scattering structures in the central area mitigates dark current compared to an arrangement where light scattering structures are included under the entire microlens.

Figure 14:
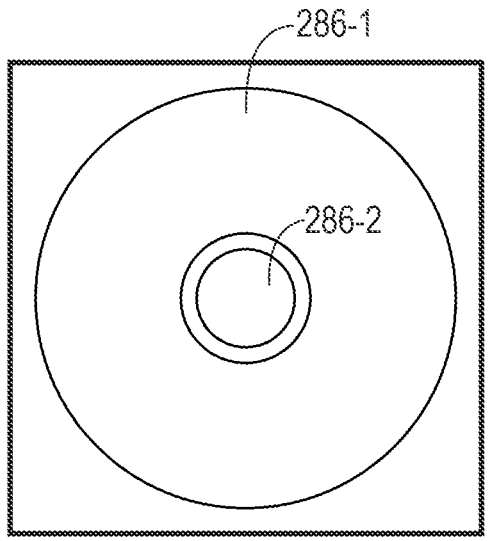
FIG. 14 is a top view of an illustrative microcell with a toroidal microlens and an additional microlens formed in the central opening of the toroidal microlens in accordance with an embodiment.
Figure 15:
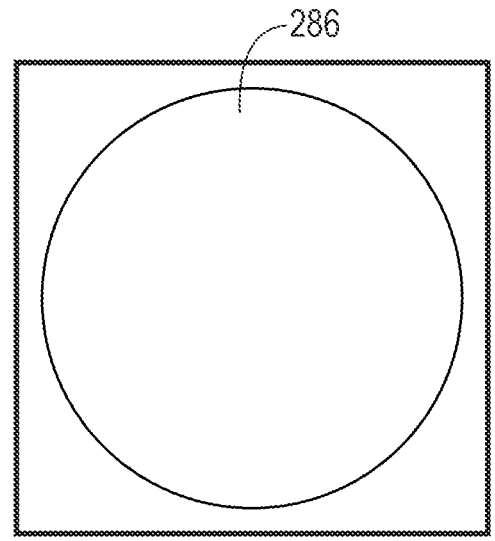
FIG. 15 is a top view of an illustrative microcell with a single microlens in accordance with an embodiment.
Figure 16:
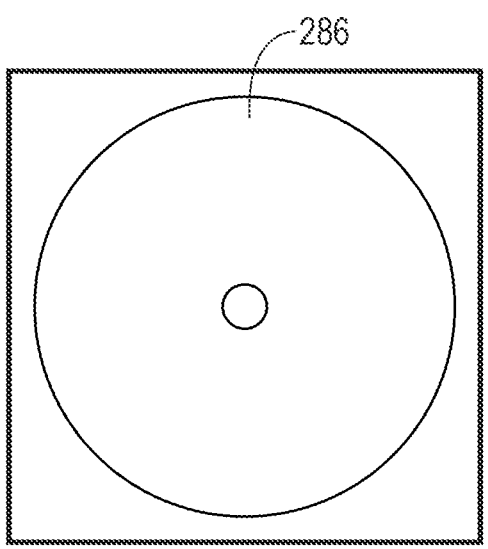
FIG. 16 is a top view of an illustrative microcell with a single toroidal microlens in accordance with an embodiment.

FIGS. 14-17 show top views of illustrative microlenses that may be formed over a microcell. FIG. 14 shows an example with a toroidal microlens 286-1 and an additional microlens 286-2 that fills the central opening of toroidal microlens 286-1 (e.g., similar to as shown in FIG. 7). FIG. 15 is a top view of a spherical microlens 286 that is formed over a microlens. Microlens 286 in FIG. 15 may have a curved, continuous upper surface (that may have spherical curvature). This type of arrangement is similar to the arrangement of FIG. 8. FIG. 16 is a top view of a toroidal microlens 286 that may be formed over the microlens (similar to as in FIG. 13). The toroidal microlens 286 may be ring-shaped and have a central opening.

Figure 17:
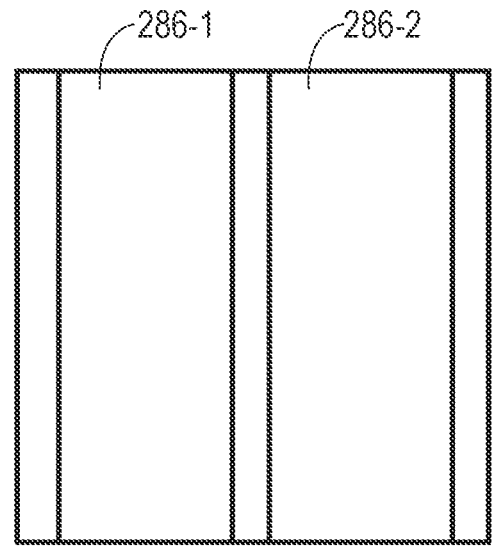
FIG. 17 is a top view of an illustrative microcell with two cylindrical microlenses in accordance with an embodiment.

Instead of a toroidal microlens, two adjacent cylindrical microlenses may be formed over the microcell. FIG. 17 shows an example of microlens 286-1 and microlens 286-2 that are adjacent and extend across the microcell. Microlenses 286-1 and 286-2 in FIG. 17 may be cylindrical microlenses.

In general, each microcell may be covered by any desired microlens(es). However, there may be a correlation between the microlens design and the arrangement of the light scattering structures for the microcell. The microlenses may focus more light on a first area of the substrate than a second area of the substrate. The light scattering structures may therefore have a greater density (e.g., a higher percentage of the substrate is etched for the scattering structures) in the first area of the substrate than the second area of the substrate (to more effectively scatter the light). The second area of the substrate (with a lower density of scattering structures) may have no scattering structures (e.g., the scattering structures are entirely omitted) or may have a lower, non-zero density of scattering structures. The transition between different densities may be gradual or immediate.

As an example of this design technique, consider FIG. 13. The toroidal microlens 286 focuses more light on a ring-shaped portion of the substrate than the central portion of the substrate. Accordingly, the light scattering structures are included in the ring-shaped portion of the substrate that receives the incident light and are omitted in a central portion of the substrate that receives less incident light from the toroidal microlens.

There may also be a correlation between the arrangement of the light scattering structures and the shape of the underlying SPAD. For example, the light scattering structures may have a layout and size that is selected to direct the light to the SPAD and not surrounding dead zones.

The foregoing is merely illustrative of the principles of this invention and various modifications can be made by those skilled in the art. The foregoing embodiments may be implemented individually or in any combination.

What is claimed is:

1. A semiconductor device comprising:
a substrate;
a photosensitive area formed in the substrate;
a microlens formed over the photosensitive area; and
a plurality of light scattering structures in the substrate over the photosensitive area, wherein, in a first portion of the substrate, there is a first non-zero number of the light scattering structures per unit area, wherein, in a second portion of the substrate, there is a second non-zero number of the light scattering structures per the unit area, wherein the second non-zero number is greater than the first non-zero number, and wherein the second portion of the substrate forms a ring around the first portion of the substrate.

2. A semiconductor device comprising:
a substrate;
a photosensitive area formed in the substrate;
a microlens formed over the photosensitive area; and
a plurality of light scattering structures in the substrate over the photosensitive area, wherein, in a first portion of the substrate, there is a first non-zero number of the light scattering structures per unit area, wherein, in a second portion of the substrate, there is a second non-zero number of the light scattering structures per the unit area, wherein the second non-zero number is greater than the first non-zero number, wherein the microlens has an outer periphery, and wherein the first and second portions of the substrate are both, in a direction parallel to a surface normal of the substrate, directly overlapped by an area defined by the outer periphery of the microlens.

3. The semiconductor device defined in claim 1, wherein the microlens is configured to focus a greater amount of light to the second portion of the substrate than the first portion of the substrate.

4. The semiconductor device defined in claim 1, wherein the microlens is a toroidal microlens.

5. The semiconductor device defined in claim 4, wherein the toroidal microlens has a central opening and wherein the semiconductor device includes an additional microlens that is formed in the central opening.

6. The semiconductor device defined in claim 4, wherein the toroidal microlens has a central opening, wherein the first portion of the substrate is overlapped by the central opening, and wherein the second portion of the substrate is not overlapped by the central opening.

7. The semiconductor device defined in claim 1, wherein each one of the plurality of light scattering structures comprises a trench in a surface of the substrate and material formed in the trench that has a lower refractive index than the substrate.

8. The semiconductor device defined in claim 7, wherein the material formed in the trench comprises a passivation layer and a buffer layer.

9. The semiconductor device defined in claim 1, wherein the plurality of light scattering structures comprises a first light scattering structure having a first width and a second light scattering structure having a second width that is different than the first width.

10. The semiconductor device defined in claim 1, wherein there is a gradual change in the number of the light scattering structures per the unit area between the first non-zero number and the second non-zero number.

11. A semiconductor device comprising:
a substrate;
a photosensitive area formed in the substrate;
a microlens formed over the photosensitive area; and
a plurality of light scattering structures in the substrate over the photosensitive area, wherein, in a first portion of the substrate, there is a first non-zero number of the light scattering structures per unit area, wherein, in a second portion of the substrate, there is a second non-zero number of the light scattering structures per the unit area, wherein the second non-zero number is greater than the first non-zero number, and wherein the first portion of the substrate forms a ring around the second portion of the substrate.

12. The semiconductor device defined in claim 11, wherein the microlens is configured to focus a greater amount of light to the second portion of the substrate than the first portion of the substrate.

13. The semiconductor device defined in claim 11, wherein the microlens is a toroidal microlens.

14. The semiconductor device defined in claim 13, wherein the toroidal microlens has a central opening and wherein the semiconductor device includes an additional microlens that is formed in the central opening.

15. The semiconductor device defined in claim 13, wherein the toroidal microlens has a central opening, wherein the first portion of the substrate is overlapped by the central opening, and wherein the second portion of the substrate is not overlapped by the central opening.

16. The semiconductor device defined in claim 11, wherein each one of the plurality of light scattering structures comprises a trench in a surface of the substrate and material formed in the trench that has a lower refractive index than the substrate.

17. The semiconductor device defined in claim 16, wherein the material formed in the trench comprises a passivation layer and a buffer layer.

18. The semiconductor device defined in claim 11, wherein the plurality of light scattering structures comprises a first light scattering structure having a first width and a second light scattering structure having a second width that is different than the first width.

19. The semiconductor device defined in claim 11, wherein there is a gradual change in the number of the light scattering structures per the unit area between the first non-zero number and the second non-zero number.

* * * * *